United States Patent
Oishi et al.

(10) Patent No.: US 6,744,186 B2
(45) Date of Patent: Jun. 1, 2004

(54) PLASMA DISPLAY APPARATUS

(75) Inventors: Toshiharu Oishi, Shizuoka-ken (JP);
Sadao Yokoi, Shizuoka-ken (JP);
Koichi Kaneko, Shizuoka-ken (JP);
Daisuke Takao, Shizuoka-ken (JP)

(73) Assignees: Pioneer Corporation, Tokyo (JP);
Pioneer Display Products Corporation, Shizuoka (JP)

( * ) Notice: Subject to any disclaimer, the term of this patent is extended or adjusted under 35 U.S.C. 154(b) by 0 days.

(21) Appl. No.: 09/859,487

(22) Filed: May 18, 2001

(65) Prior Publication Data

US 2001/0048600 A1 Dec. 6, 2001

(30) Foreign Application Priority Data

Jun. 2, 2000 (JP) ........................................ 2000-166060

(51) Int. Cl.$^7$ ................................................ H01J 17/28
(52) U.S. Cl. .......................... 313/46; 313/493; 313/573
(58) Field of Search ...................... 313/46, 493, 573, 313/582, 634, 294, 40, 581, 48, 45; 362/294

(56) References Cited

U.S. PATENT DOCUMENTS 5,831,374 A * 11/1998 Morita et al. ................. 313/46
5,971,566 A * 10/1999 Tani et al. ..................... 313/46

* cited by examiner

*Primary Examiner*—Ashok Patel
*Assistant Examiner*—Ken A Berck
(74) *Attorney, Agent, or Firm*—Arent Fox PLLC

(57) ABSTRACT

A plasma display apparatus includes a plasma display panel, a circuit board mounting a drive circuit for driving the plasma display panel, a chassis structure provided on the backside of the plasma display panel for supporting the plasma display panel and for mounting the circuit board. In particular, the chassis structure comprises a first chassis member mounting the circuit board, and a second chassis member fixed on the backside of the plasma display panel, a plurality of support portions provided between the first and second chassis members for supporting the two chassis members and for forming a predetermined interval between the two chassis members.

5 Claims, 2 Drawing Sheets

PLASMA DISPLAY APPARATUS

BACKGROUND OF THE INVENTION

1. Field of the Invention

The present invention relates to a plasma display apparatus, particularly to a plasma display apparatus having an improved chassis structure provided on the backside of a plasma display panel.

2. Description of the Related Prior Art

Recently, plasma display apparatus has been in spreading which is usually large in screen size and thin in thickness. Such a plasma display apparatus comprises a plasma display panel (hereinafter, simply referred to as PDP) including a pair of substrate plates arranged to face each other with an electric discharge space formed therebetween, a plurality of row electrodes and a plurality of column electrodes arranged orthogonal to the row electrodes, a plurality of electric discharge cells each formed at an intersection between a row electrode and a column electrode, so that a desired displaying can be achieved by effecting electric discharges in various discharge cells.

Further, such a plasma display apparatus has a chassis structure located on the backside of the PDP. The chassis structure is provided to support a PDP as well as a circuit board mounting a drive circuit for driving the PDP. In practice, such a chassis structure is required to function not only as support means, but also as cooling means for releasing a heat generated by the PDP so as to cool the PDP.

FIG. 4 is an explanatory view showing a chassis structure for use in a conventional plasma display apparatus. As shown in FIG. 4, PDP 1 has a glass substrate plate 1A and a glass substrate plate 1B, which are bonded together with an electric discharge space formed therebetween. A circuit board 2 mounting a drive circuit for driving the PDP 1 is mounted through a chassis structure 3 on the PDP 1.

Here, chassis structure 3 comprises a plurality of longitudinal members 3A and a plurality of lateral members 3B, thus forming a lattice arrangement. In practice, both the longitudinal and lateral members are all made of a metal such as aluminum having a high thermal conductivity. The circuit board 2 is electrically connected to the PDP 1 by means of a flexible cable 4. The chassis 3 and the PDP 1 are bonded together through a plurality of strip-like pressure sensitive adhesive double coated tapes 5, in a manner shown in FIG. 4.

However, when the above-described conventional chassis structure is required to have a sufficient strength for supporting the PDP 1, the only effective measure is to increase the thickness of both the longitudinal members 3A and the lateral members 3B. This, however, undesirably increases the total weight of the plasma display apparatus. Moreover, since the chassis structure involves a lattice arrangement, it will be difficult to perform an assembling operation to form the chassis structure, because the longitudinal and lateral members 3A and 3B having an increased thickness and an increased weight are relatively difficult to deal with. As a result, there has been a problem that the productivity is comparatively low.

In addition, as to the heat radiation of the conventional plasma display apparatus, since the lateral members 3B are arranged at an interval on the PDP 1, it is difficult for the whole apparatus to obtain a uniform radiation effect, thus making it impossible to ensure a sufficient each radiation.

On the other hand, with other conventional plasma display apparatus, a chassis structure is usually formed by performing a pressing treatment on a single plate so as to form several convex portions for attaching a circuit board. However, if the chassis structure is required to ensure an increased strength, the same measure would have to be taken in the same manner as described in the above, bringing about the same problems of increasing the total weight of the display apparatus as well as increasing the production cost.

SUMMARY OF THE INVENTION

An object of the present invention is to provide an improved plasma display apparatus which is light in weight and low in production cost, has a sufficient support strength and a sufficient heat radiation effect.

In a first aspect of the present invention, there is provided a plasma display apparatus including a plasma display panel, a circuit board mounting a drive circuit for driving the plasma display panel, a chassis structure provided on the backside of the plasma display panel for supporting the plasma display panel and for mounting the circuit board. In particular, the chassis structure comprises a first chassis member mounting the circuit board, and a second chassis member fixed on the backside of the plasma display panel, a plurality of support portions provided between the first and second chassis members for supporting the two chassis members and for forming a predetermined interval between the two chassis members.

In a second aspect of the present invention, the second chassis member's one surface fixed on the backside of the plasma display panel is in a plain state, and is bonded on the backside of the plasma display panel.

In a third aspect of the present invention, the number of support portions located in central area is larger than that of support portions located in edge areas on the plasma display panel.

In a fourth aspect of the present invention, the plurality of support portions are projections formed on the first chassis member.

In a fifth aspect of the present invention, the plurality of projections are formed by carrying out a drawing treatment on the first chassis member.

According to the first aspect of the present invention, a chassis structure is provided to support a plasma display panel and a circuit board mounting a drive circuit for driving the plasma display panel. The chassis structure is comprised of a first chassis member and a second chassis member. A plurality of support portions are provided between the first and second chassis members for supporting the two chassis members and producing an interval between the two chassis members. In this way, by virtue of the interval and support portions, a total area for heat radiation has become larger than prior art, thereby making it possible to obtain an improved heat radiation effect. Further, since the chassis structure is formed by the first chassis member and the second chassis member, the second chassis member may be made by a material having a high thermal conductivity, while the first chassis member may be made by a highly processable material. Therefore, it is possible to obtain an improved chassis structure which has desired thermal conductive properties and is also suitable for production in a large quantity.

According to the second aspect of the present invention, the chassis structure is so formed that the second chassis member's one surface fixed on the backside of the plasma display panel is in a plain state, and is bonded on the backside of the plasma display panel. In this way, a heat irradiation effect may be made uniform over the entire plasma display panel, thereby ensuring a uniform temperature distribution over the entire plasma display panel and thus alleviating an undesired heat stress.

According to the third aspect of the present invention, since the number of support portions located in central area is larger than that of support portions located in edge areas on the plasma display panel, the plasma display panel's central area involving the largest amount of heat irradiation is allowed to have an improved heat irradiation through a relatively large numbers of the support portions.

According to the fourth and fifth aspects of the present invention, since the chassis structure comprises only the first chassis member and the second chassis member, and since the support portions located between the two chassis members are formed through a drawing treatment, it is possible to ensure that an attachment structure for combining together the first chassis member and the second chassis member can be held by the first chassis member which is located relatively far away from the plasma display panel, and that the second chassis member can be made flat. Therefore, it is allowed to ensure a uniform heat irradiation, and to reduce the number of parts forming the chassis structure, thus reducing the production cost. In addition, since a plurality of projections are formed as the support portions on the first chassis member, and are adhesively combined with the second chassis members, it is possible to make the chassis to be in a solid structure, thereby enabling the chassis structure to have an improved bending strength.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMEN

Figure 1:
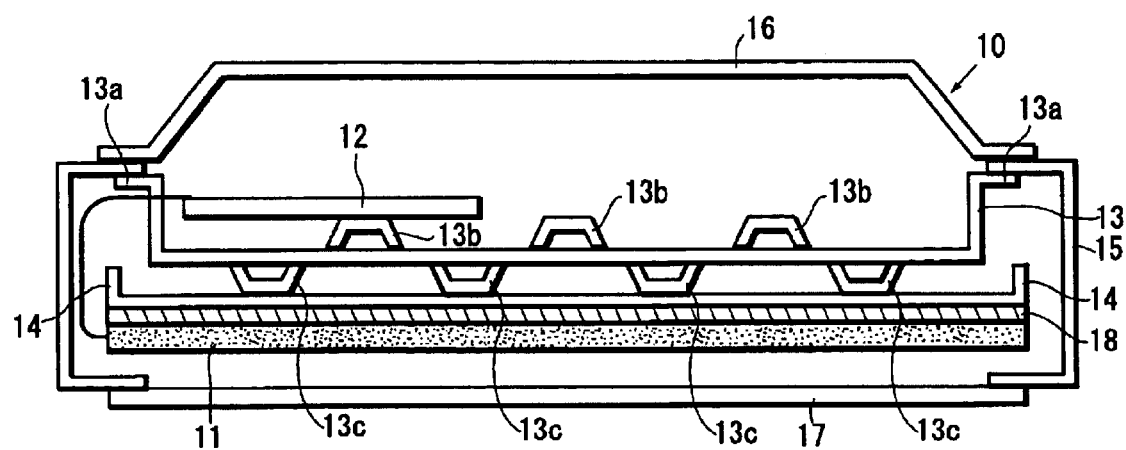
FIG. 1 is an explanatory view showing an internal structure of a plasma display apparatus formed according to a first embodiment of the present invention.

A first embodiment of the present invention will be described in the following with reference to the accompanying drawings. FIG. 1 is an explanatory view showing the internal structure of a plasma display apparatus formed according to the first embodiment of the present invention. As shown in FIG. 1, a plasma display apparatus 10 comprises a plasma display panel (PDP) 1 formed by bonding together two glass substrates (with one serving as a front substrate and the other a rear substrate) with a narrow discharge space formed therebetween, a circuit board mounting a power source circuit and a drive circuit for driving the PDP 11, a first chassis member 13 and a second chassis member 14 for supporting the PDP 11 and the circuit board 12. Specifically, the PDP 11 and the chassis members 13, 14 are enclosed in a housing formed by a pair of side panels 15, a rear case 16 and a front panel 17.

The first chassis member 13 is a plate-like member made of a metal such as aluminum. Two side panels 15 are connected to two side projections 13a of the first chassis member 13. The first chassis member 13's one side close to the rear case 16 has a plurality of projections 13b for connecting the circuit board 12. The first chassis member 13's other side close to the PDP 1 has a plurality of support projections 13c adapted to be connected with the second chassis member 14.

Similar to the first chassis member 13, the second chassis member 14 is also a plate-like member made of a metal such as aluminum. The second chassis member 14's one side close to the PDP 11 has been formed into a plain surface combinable with the backside of the PDP 11 by virtue of a pressure sensitive adhesive double coated tape 18.

Figure 2:
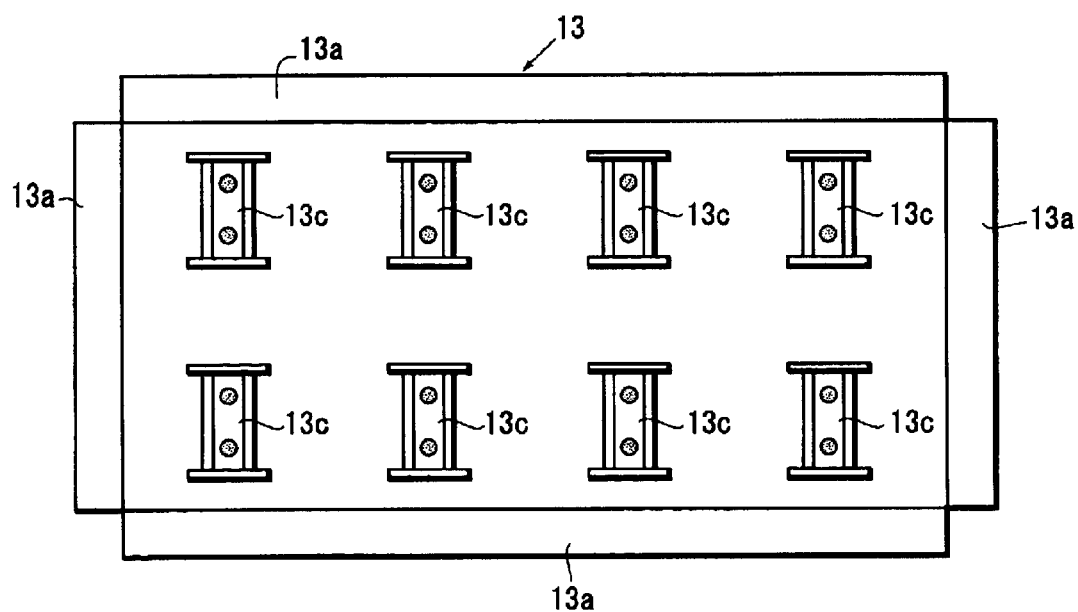
FIG. 2 is a plan view showing a first chassis member 13 for use in the first embodiment of the present invention.

FIG. 2 is a plan view showing the first chassis member 13 when viewed from the second chassis member 14. As shown in FIG. 2, a plurality of (eight) projections 13c are formed on the first chassis member 13's one surface facing the second chassis member 14. The projections 13c are formed by partially pressing a metal plate forming the first chassis member 13. The top portions of the projections 13c are combined with the outer surface of the second chassis member 14 by welding or caulking, in a manner such that the first chassis member 13 is supported by the second chassis member 14 with a predetermined interval formed therebetween.

According to the present embodiment, since the two chassis members 13 and 14 are connected with each other with a predetermined interval formed therebetween, it is possible to obtain an increased heat radiating area when compared with a conventional arrangement using only one single chassis member or the aforementioned conventional arrangement involving a lattice structure formed by mutually orthogonal longitudinal and lateral members, thereby ensuring an improved radiation effect when releasing a heat generated by the PDP 11. Further, since two chassis members 13 and 14 are combined to form a solid structure, it is sure to improve its strength against a possible bending of the chassis structure.

Furthermore, since one surface of the second chassis member 14 is in a flat state and bonded on to the backside (back surface) of the PDP 11, the entire back surface of the PDP 11 can radiate a heat generated therefrom, enabling the chassis structure to produce a uniform radiation effect over the entire surface of the PDP 11, ensuring a uniform temperature distribution over the entire plasma display panel and thus effectively alleviating an undesired heat stress on the PDP 11.

The rear case 16 is formed by a metal and is connected with the first chassis member 13, so that the heat generated by the PDP 11 can be transferred to the rear case 16 by way of the first chassis member 13, thereby further improving the heat radiation effect. Further, since the chassis structure in the present embodiment is formed by two metal plates (two chassis members), with the first chassis member 13 (having a plurality of projections 13ba, 13c and mounting the circuit board 12) being formed by an easily processable material, while the second chassis member 14 being formed by a material having a high thermal conductivity, it is sure for respective members of the chassis structure to provide respective functions.

Figure 3:
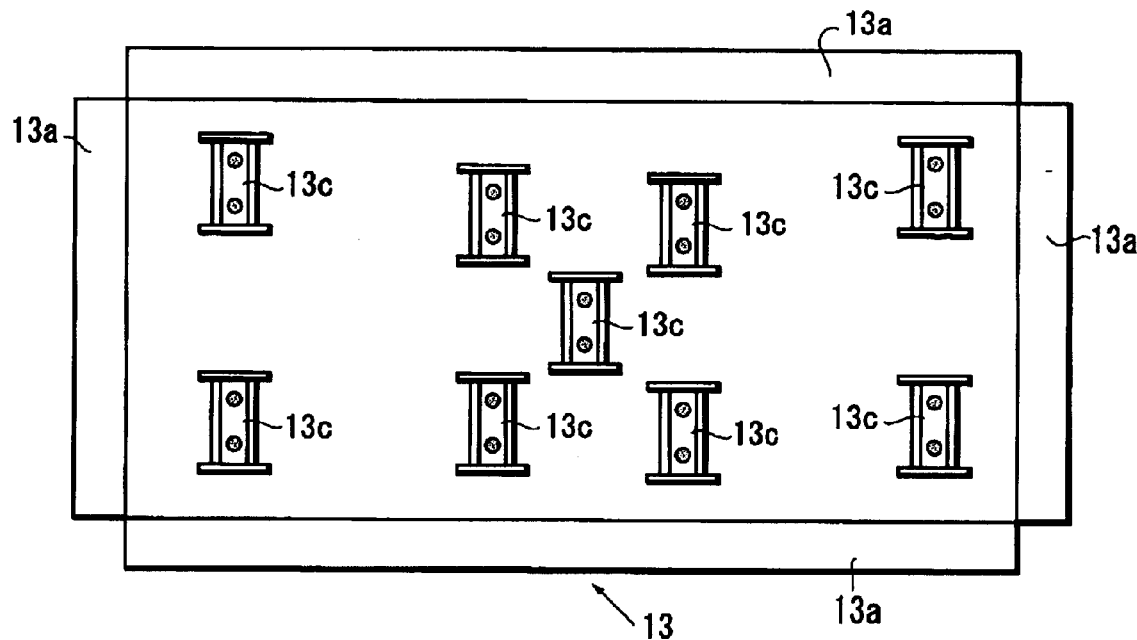
FIG. 3 is a plan view showing a first chassis member 13 for use in a second embodiment of the present invention.
Figure 4:
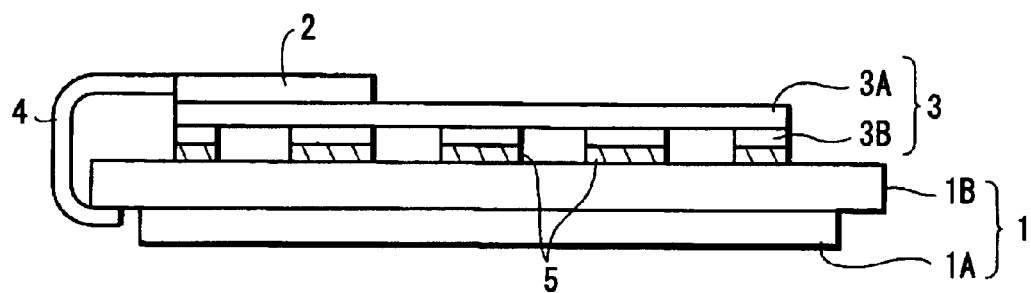
FIG. 4 is an explanatory view showing a conventional plasma display apparatus.

A second embodiment of the present invention will be described with reference to FIG. 3 which is also a plan view showing the first chassis member 13 when viewed from the second chassis member 14. In fact, the second embodiment is almost the same as the first embodiment shown in FIG. 2 except that the projections 13 provided on the central area of the first chassis member 13 are more than those provided close to the edge areas thereof. In this way, although the central area of the plasma display panel produces an amount of heat larger than any other areas, this amount of heat can be efficiently transferred outwardly by way of the centrally located projections 13c, thereby ensuring a uniform temperature distribution on the PDP 11, and thus obtaining a further improved heat radiation effect.

As described in the above, each of the chassis structures described in the above embodiments includes two pieces of metal plates, so that it becomes possible to manufacture an improved plasma display apparatus high in radiation efficiency and low in production cost, if it is compared with a conventional apparatus involving a single-plate structure or a multiple-plate structure.

Thus, with the use of the present invention, it is possible to provide an improved plasma display apparatus which is light in weight and low in cost, has a sufficient support strength and a sufficient heat radiation efficiency.

While the invention has been described in conjunction with preferred specific embodiments thereof, it will be understood that this description is intended to illustrate and not limit the scope of the invention, which is defined by the following claims.

What is claimed is:

1. A plasma display apparatus including a plasma display panel, a circuit board mounting a drive circuit for driving the plasma display panel, a chassis structure provided on the backside of the plasma display panel for supporting the plasma display panel and for mounting the circuit board, wherein the chassis structure comprises a first chassis member mounting the circuit board, and a second chassis member fixed on the backside of the plasma display panel, a plurality of support portions provided between the first and second chassis members for supporting the two chassis members and for forming a predetermined interval between the two chassis members;

wherein the plasma display apparatus further includes a rear case connected with the chassis structure for covering the chassis structure;

wherein the backside of the plasma display panel is entirely and intimately supported by the second chassis member.

2. A plasma display apparatus according to claim 1, wherein the second chassis member's one surface fixed on the backside of the plasma display panel is in a plain state, and is bonded on the backside of the plasma display panel.

3. A plasma display apparatus according to claim 1 or 2, wherein the number of support portions located in central area is larger than that of support portions located in edge areas on the plasma display panel.

4. A plasma display apparatus according to claim 1, wherein the plurality of support portions are projections formed on the first chassis member.

5. A plasma display apparatus according to claim 4, wherein the plurality of projections are formed by carrying out a drawing treatment on the first chassis member.

* * * * *